United States Patent
Carlson et al.

(10) Patent No.: US 6,489,220 B2
(45) Date of Patent: Dec. 3, 2002

(54) METHOD AND A SYSTEM FOR SEALING AN EPITAXIAL SILICON LAYER ON A SUBSTRATE

(75) Inventors: David K. Carlson, Santa Clara, CA (US); Dale R. Du Bois, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/140,584

(22) Filed: May 6, 2002

(65) Prior Publication Data
US 2002/0127826 A1 Sep. 12, 2002

Related U.S. Application Data

(62) Division of application No. 09/788,121, filed on Feb. 16, 2001.

(51) Int. Cl.[7] .......................... H01L 21/20; H01L 21/31
(52) U.S. Cl. .................... 438/478; 438/770; 438/787
(58) Field of Search ........................... 438/478, 479, 438/481, 758, 762, 763, 769, 770, 778, 787, 902, 903, 946, 958

(56) References Cited

U.S. PATENT DOCUMENTS

| | | | |
|---|---|---|---|
| 4,341,592 A | 7/1982 | Shortes et al. ............ 156/643 |
| 4,409,260 A | 10/1983 | Pastor et al. ................ 427/82 |
| 4,872,947 A | 10/1989 | Wang et al. ............... 156/643 |
| 4,906,595 A | 3/1990 | van der Plas et al. ...... 437/239 |
| 5,057,463 A | 10/1991 | Bryant et al. ............. 437/238 |
| 5,089,441 A | 2/1992 | Moslehi .................... 437/225 |
| 5,228,208 A | 7/1993 | White et al. .................. 34/15 |
| 5,229,334 A | 7/1993 | Kato .......................... 437/239 |
| 5,259,881 A | 11/1993 | Edwards et al. ............ 118/719 |
| 5,292,393 A | 3/1994 | Maydan et al. ............. 156/345 |
| 5,294,571 A | 3/1994 | Fujishiro et al. ........... 437/239 |
| 5,316,981 A | 5/1994 | Gardner et al. ............. 437/235 |
| 5,328,360 A | 7/1994 | Yokokawa .................. 432/250 |
| 5,330,935 A | 7/1994 | Dobuzinsky et al. ....... 437/239 |
| 5,360,769 A | 11/1994 | Thakur et al. .............. 437/239 |
| 5,378,283 A | 1/1995 | Ushikawa ................... 118/719 |
| 5,380,682 A | 1/1995 | Edwards et al. ............ 437/225 |
| 5,693,578 A | 12/1997 | Nakanishi et al. .......... 437/238 |
| 5,766,360 A | 6/1998 | Sato et al. ................... 118/666 |
| 5,981,399 A | 11/1999 | Kawamura et al. ......... 438/715 |
| 5,994,209 A | * 11/1999 | Yieh et al. .................. 438/541 |
| 6,007,675 A | 12/1999 | Toshima ..................... 156/345 |
| 6,017,820 A | 1/2000 | Ting et al. .................. 438/689 |
| 6,072,226 A | 6/2000 | Thakur et al. .............. 257/506 |
| 6,077,751 A | 6/2000 | Marcus et al. ............. 438/308 |
| 6,133,086 A | * 10/2000 | Huang et al. ............... 438/785 |
| 6,166,509 A | 12/2000 | Wyka et al. ................ 318/640 |
| 6,191,051 B1 | * 2/2001 | Shimizu ...................... 438/770 |
| 6,224,934 B1 | * 5/2001 | Hasei et al. ................... 427/10 |
| 6,228,173 B1 | * 5/2001 | Okase et al. ................ 118/719 |
| 6,232,248 B1 | * 5/2001 | Shinriki et al. ............. 438/785 |
| 6,306,735 B1 | * 10/2001 | Schauer ...................... 438/478 |
| 6,338,756 B2 | 1/2002 | Dietze |
| 6,376,387 B2 | * 4/2002 | Carlson et al. ............. 438/481 |

FOREIGN PATENT DOCUMENTS

WO    WO 95/20823    1/1995

\* cited by examiner

*Primary Examiner*—Savitri Mulpuri
(74) *Attorney, Agent, or Firm*—Blakely Sokoloff Taylor & Zafman

(57) ABSTRACT

A system for processing a wafer is provided. Ultraviolet light radiates through a first amount of oxygen gas in an ozone generation chamber so that the first amount of oxygen gas is converted to a first amount of ozone gas. The first amount of ozone gas flows from the ozone generation chamber into a loadlock chamber and a wafer is exposed to the first amount of ozone gas. The ultraviolet light also radiates through a window and then through a second amount of oxygen gas in the loadlock chamber so that the second amount of unconverted gas is converted to a second amount of ozone gas. The wafer held by the wafer holder is also exposed to the second amount of ozone gas.

11 Claims, 15 Drawing Sheets

METHOD AND A SYSTEM FOR SEALING AN EPITAXIAL SILICON LAYER ON A SUBSTRATE

CROSS-REFERENCE TO RELATED APPLICATIONS

The present patent application is a Divisional of prior application Ser. No. 09/788,121, filed Feb. 16, 2001 entitled METHOD AND A SYSTEM FOR SEALING AN EPITAXIAL SILICON LAYER ON A SUBSTRATE.

BACKGROUND OF THE INVENTION

1). Field of the Invention

This invention relates to a method of and a system for sealing an epitaxial silicon layer formed on a semiconductor wafer.

2). Discussion of Related Art

Integrated circuits are formed in and on silicon and other semiconductor wafers. Wafers are made by extruding an ingot from a silicon bath and sawing the ingot into multiple wafers. In the case of silicon, the material of the wafers is monocrystalline. An epitaxial silicon layer is then formed on the monocrystalline material of the wafer. The epitaxial silicon layer is typically doped with boron and has a dopant concentration of about $1 \times 10^{16}$ atoms per centimeter cube. A typical epitaxial silicon layer is about five microns thick. The material of the epitaxial silicon layer has better controlled properties than the monocrystalline silicon for purposes of forming semiconductor devices therein and thereon.

Once the epitaxial silicon layer is formed, the wafer is removed from the wafer processing chamber and exposed to ambient air. The air oxidizes the exposed epitaxial silicon layer to form a native oxide layer thereon. The epitaxial silicon layer and the native oxide layer are exposed to contaminants in the air and are usually filled with impurities and particles. When semiconductor devices are formed on a surface which is filled with impurities, the electronic devices often fail.

It has been suggested that exposure of an epitaxial silicon layer to ozone gas will provide an efficient process for forming a very pure oxide layer on the epitaxial silicon layer. Furthermore, U.S. Pat. application Ser. No. 09/350,805 describes a system which is used to process a wafer so that an epitaxial silicon layer is formed thereon, followed by exposure to ozone gas in a loadlock chamber. The wafer is however exposed with other wafers and exposure takes at least 20 minutes. Such slow exposure may inhibit a process where only a few wafers are processed.

SUMMARY OF THE INVENTION

A system for processing a wafer is provided comprising a chamber body, a window, a wafer holder, an ozone generation chamber, and at least one ultraviolet lamp. The window is transmissive to ultraviolet light and is mounted to the chamber body. The chamber body and the window jointly form a chamber. The chamber defines an enclosure and has at least a first opening for transferring a wafer therethrough from an area externally of the chamber into the enclosure. The wafer holder is located within the chamber to hold the wafer in the enclosure. The ozone generation chamber is located externally of the chamber and is in communication with the enclosure. The ultraviolet lamp has a filament which, when electric current flows therethrough creates ultraviolet light. The ultraviolet light therefrom radiates through a first amount of unconverted gas in the ozone generation chamber so that the first amount of unconverted gas is converted to a first amount of ozone gas. The first amount of ozone gas flows from the ozone generation chamber into the enclosure and the wafer held by the wafer holder is exposed to the first amount of ozone gas. The ultraviolet light also radiates through the window and then through a second amount of unconverted gas in the enclosure so that the second amount of unconverted gas is converted to a second amount of ozone gas. The wafer held by the wafer holder is also exposed to the second amount of ozone gas.

BRIEF DESCRIPTION OF THE DRAWINGS

The invention is further described by way of example with reference to the accompanying drawings wherein.

DETAILED DESCRIPTION OF THE INVENTION

Batch-exposure to Low Concentration Levels of Ozone Gas Suitable for Epitaxial Silicon Deposition on a Large Number of Wafers The present invention relates to a method whereby an epitaxial silicon layer formed on a silicon wafer is sealed with an oxide formed due to exposure to ozone gas. A plurality of the wafers are located in a batch in a loadlock chamber and exposed to ozone gas under controlled conditions. The ozone gas forms a stable and dean oxide layer on the epitaxial silicon layer of each wafer. The oxide layer can later be removed to leave the epitaxial silicon layer exposed and containing substantially no impurities. There are certain advantages for processing the wafers in the loadlock chamber. One advantage is that another chamber which is designated for a step in an existing process does not have to be dedicated for exposing the wafers to ozone gas. Another advantage is that such a system is relatively safe because there is a substantially reduced likelihood that the ozone gas will mix with hydrogen gas within the system and cause an explosion, in particular because the pressure within the loadlock chamber is lower than a chamber in the system where hydrogen gas is used. The system is also safe because the pressure within the loadlock chamber is always below atmospheric pressure of an area around the loadlock chamber when ozone gas is within the loadlock chamber so that there is reduced likelihood that the ozone gas will escape to a surrounding area and cause an explosion. Another advantage is that the overall time taken to process wafers is maintained.

Figure 1:
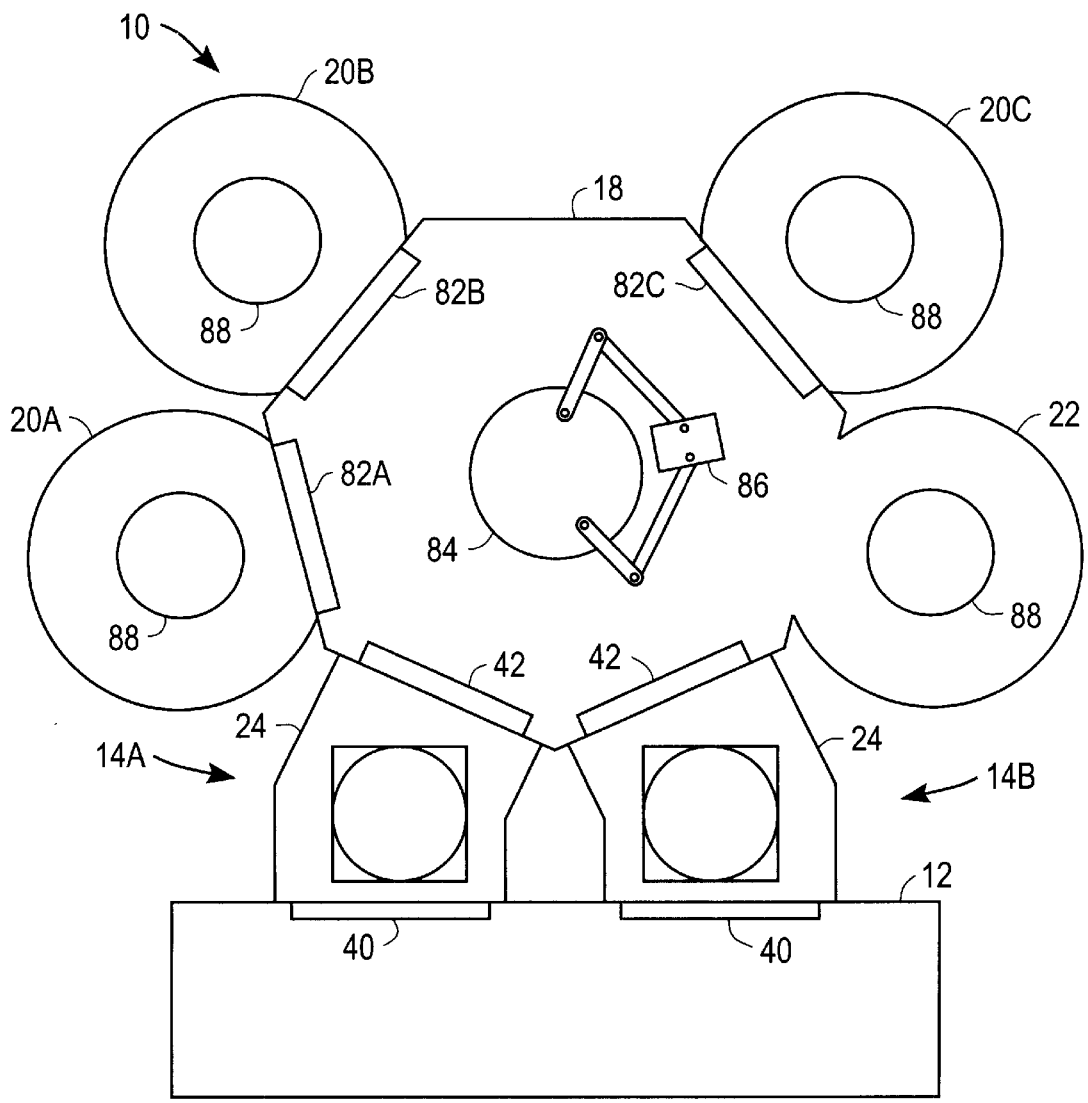
FIG. 1 is a plan view of a system for processing a wafer.

FIG. 1 of the accompanying drawings illustrates a system 10 for processing a semiconductor wafer. The system 10 is of the kind sold as the Epi Centura system sold by Applied Materials of Santa Clara, Calif. The system 10 includes a factory integration unit 12, first and second batch loadlock assemblies 14A and 14B, a transfer chamber 18, first, second, and third wafer processing chambers 20A, 20B, and 20C, and a cooldown chamber 22.

Figure 2:
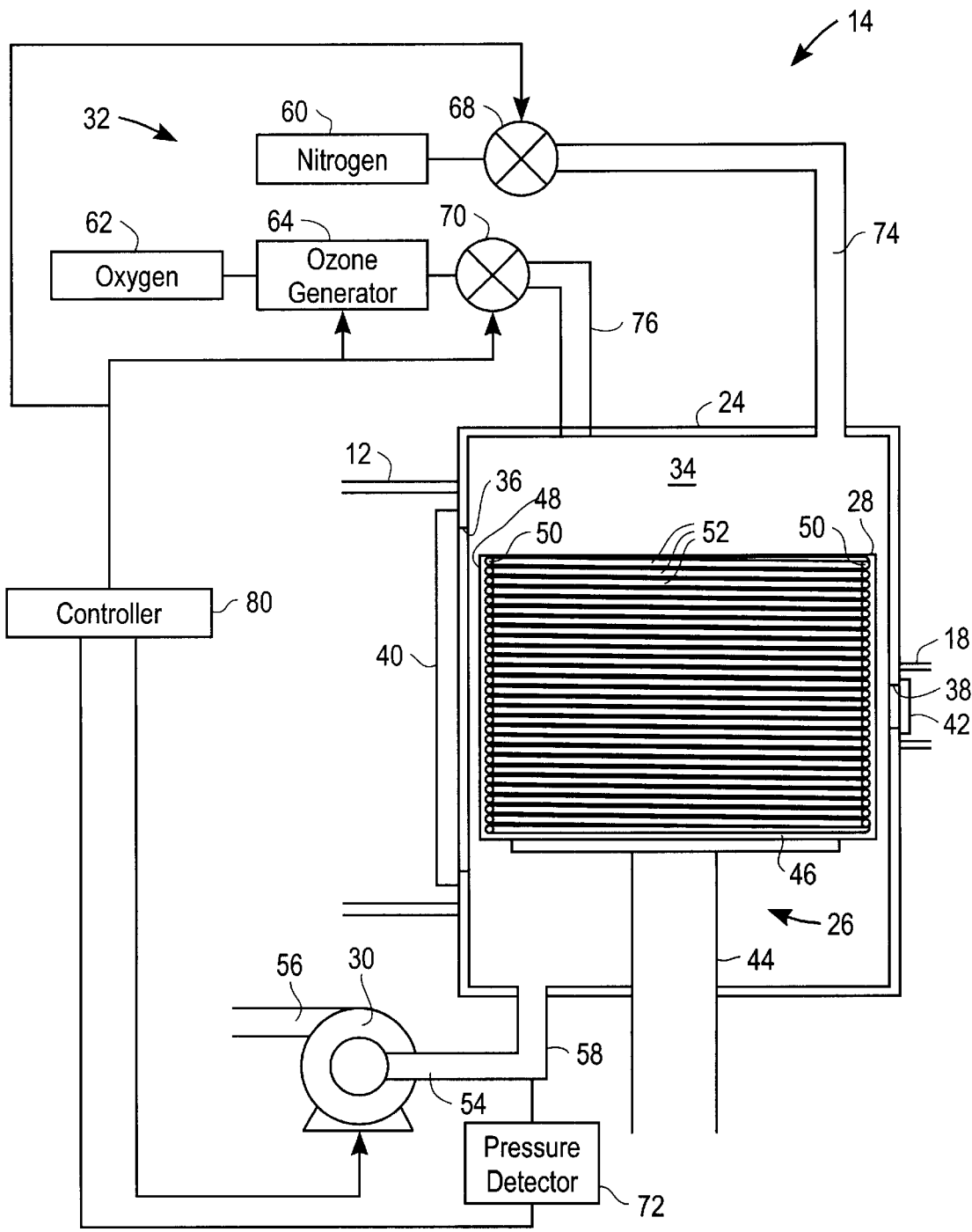
FIG. 2 is a diagram of a loadlock assembly forming part of the system and illustrates a loadlock chamber thereof in sectioned side view.

FIG. 2 illustrates one of the loadlock assemblies 14 in more detail. The loadlock assembly 14 includes a loadlock chamber 24, a cassette elevator 26, a wafer cassette 28, a pump 30, and apparatus 32 for supplying gasses into the loadlock chamber 24.

The loadlock chamber 24 defines an enclosure 34 and has a door opening 36 on one side thereof and a slitvalve opening 38 on an opposing side thereof. The factory integration unit 12 mates with the loadlock chamber 24 over the door opening 36. A door 40 is mounted to the loadlock chamber 24 for movement between a position as shown in FIG. 2 wherein the door 40 closes the door opening 36, and a position wherein the door opening 36 is open so that the confines of the factory integration unit 12 are in communication with the enclosure 34.

The transfer chamber 18 mates with the loadlock chamber 24 over the slitvalve opening 38. A slitvalve 42 is mounted to the loadlock chamber 24 for movement between a position as shown in FIG. 2 wherein the slitvalve 42 closes the slitvalve opening 38, and a position wherein the slitvalve opening 38 is open so that the enclosure 34 is in communication with the confines of the transfer chamber 18.

The cassette elevator 26 includes a shaft 44 and a support plate 46. The shaft 44 extends through an opening in a base of the loadlock chamber 24. A seal (not shown) is located between the shaft 44 and the base of the loadlock chamber 24. The support plate 46 is secured to an upper end of the shaft 44.

The wafer cassette 28 includes a frame 48 with a plurality of fins 50 located on the frame. The fins 50 are positioned relative to one another so as to be jointly capable of supporting a total of twenty-five wafers above one another. The wafer cassette 28 is located on the support plate 46. The wafer cassette 28 can be elevated by extending the shaft 44 into the loadlock chamber 24, and lowered by retracting the shaft 44 from the loadlock chamber 24. By elevating or lowering the wafer cassette 28, a respective one of the wafers 52 can be aligned with the slitvalve opening 38 and can be removed from the loadlock chamber 24 through the slitvalve opening 38.

The pump 30 has a low-pressure side 54 and a high-pressure side 56. An exhaust line 58 has one end that extends into an opening in a base of the loadlock chamber 24, and an opposed end connected to the low-pressure side 54 of the pump 30. The pump 30 can therefore be used for pumping a gas from the enclosure 34.

The apparatus 32 includes a source of nitrogen 60, a source of oxygen 62, an ozone generator 64, a nitrogen supply valve 68, and an ozone supply valve 70.

The source of nitrogen 60 is connected to the nitrogen supply valve 68. The nitrogen supply valve 68 is, in turn, connected to a nitrogen supply line 74. An opposing end of the nitrogen supply line 74 extends into an opening in an upper wall of the loadlock chamber 24. When the valve 68 is open, nitrogen gas from the source of nitrogen 60 can therefore be supplied to the enclosure 34. A diffuser (not shown) is located in the nitrogen supply line 74 to reduce the speed of the nitrogen gas.

The source of oxygen 62 may, for example, be substantially pure oxygen gas or may be air. It has been found that even filtered air is not as free of impurities as substantially pure oxygen. The oxygen is typically about 99.999% pure. Substantially pure oxygen may thus be preferred. The ozone generator 64 is connected to the source of oxygen 62.

When oxygen gas from the source of oxygen 62 is supplied to the ozone generator the ozone generator 64 generates ozone gas. The ozone generator 64 is, in turn, connected to the ozone supply valve 70. An ozone supply line 76 is connected to the ozone supply valve 70. An opposing end of the ozone supply line 76 extends into an opening in the upper wall of the loadlock chamber 24. When the valve 70 is open, ozone gas generated by the ozone generator 64 can be supplied to the enclosure 34. A diffuser (not shown) is located in the ozone supply line 76 to reduce the speed of the ozone gas.

A pressure detector 72 is connected to the exhaust line 58. The pressure detector 72 can detect the pressure within the exhaust line 58, and therefore also the pressure within the enclosure 34.

A controller 80 is used for controlling various components of the system 10 shown in FIG. 1, including the pump 30, the ozone generator 64, and the valves 68 and 70 shown in FIG. 2. The controller 80 receives input from the pressure detector 72 and controls all the components based on the pressure detected by the pressure detector 72 and other variables as will be described hereinbelow. The controller 80 is typically a computer having a processor which is programmed to execute a program which controls all the components of the system 10. The program includes processor executable code and is typically stored on a disk or other computer readable medium and then loaded into memory of the computer from where the processor of the computer reads and executes the program to control the components of the system 10. Particular features of the program and how it is constructed will be evident to one skilled in the art from the discussion that follows.

Referring again to FIG. 1, it can be seen that each wafer processing chamber 20A, 20B, or 20C leads directly off the transfer chamber 18. A respective slitvalve 82A, 82B, and 82C is mounted to open or close communication between the transfer chamber 18 and a respective one of the wafer processing chambers 20A, 20B or 20C.

The cooldown chamber 22 also leads off the transfer chamber 18 but no slitvalve is provided to open and close communication between the transfer chamber 18 and the cooldown chamber 22.

A robot 84 is located within the transfer chamber 18. The robot 84 has a blade 86 which, when the robot 84 is operated, can transfer a wafer from one of the chambers 20,22, or 24 to another. A susceptor 88 is located in each one of the chambers 20 and 22, on which the wafer can be located by the blade 86. The slitvalves 82 and the robot 84 are also under control of the controller 80 shown in FIG. 2.

Figure 3:
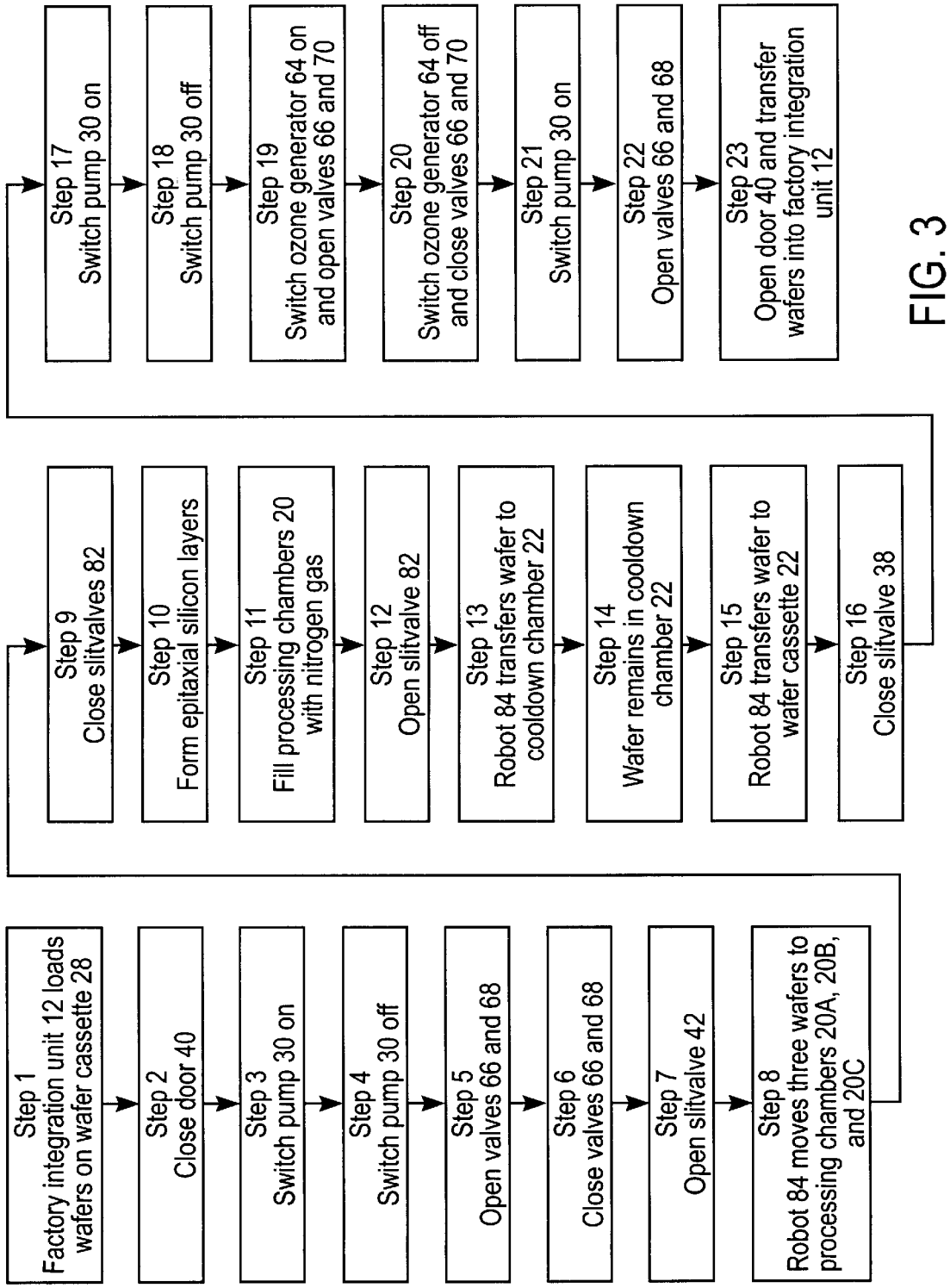
FIG. 3 is a flow chart of how the system is operated.

One example of how the controller 80 controls the system 10 is now described with reference to FIGS. 1 and 2 jointly. FIG. 3 is a flow chart which assists in illustrating how the system 10 is operated.

The slitvalves 42 are initially closed so that the confines of the transfer chamber 18 are not in communication with the loadlock chambers 24. The loadlock chamber 18 is initially evacuated to remove contamination. The loadlock chamber 18 is then backfilled with an inert gas such as nitrogen. The slitvalves 82 are open so that the wafer processing chambers 20 are in communication with the transfer chamber 18. The transfer chamber 18, the wafer processing chamber 20, and the cooldown chamber 22 are filled with an inert gas such as nitrogen gas and are at atmospheric pressure. The door 40 of the first loadlock assembly 14A is open.

A robot (not shown) located within the factory integration unit 12 then loads a total of twenty-five wafers on the wafer cassette 28 of the first loadlock assembly 14A. (Step 1). The door 40 is then closed so that the wafers 52 are isolated within the loadlock chamber 24. (Step 2).

The pump 30 is then switched on so that air passes from the enclosure 34 through the exhaust line 58 through the pump 30. (Step 3). The valves 68, and 70 are closed so that the enclosure 34 is pumped down to a pressure of about 5 Torr.

The pump 30 is then switched off. (Step 4). The valve 68 is then opened. (Step 5). Nitrogen then flows into the enclosure 34 until the pressure within the enclosure 34 is substantially the same as the pressure within the transfer chamber 18. The valve 68 is then closed. (Step 6).

The slitvalve 42 is then opened. (Step 7). The robot 84 then removes three wafers consecutively from the wafer cassette 28 and locates one wafer within the first wafer processing chamber 20A, another wafer within the second wafer processing chamber 20B, and a further wafer within the third wafer processing chamber 20C. (Step 8). The slitvalves 82 are then closed so that the wafer processing chambers 20 are isolated from the transfer chamber 18. (Step 9). An epitaxial silicon layer is then formed on the wafer in each processing chamber 20. (Step 10). A mixture of gasses is introduced into each one of the wafer processing chambers 20. One of these gasses typically includes hydrogen. Another one of the gasses is a source of silicon such as silane, dichlorosilane, or trichlorosilane. The source of silicon reacts with the hydrogen to form an epitaxial layer. Another one of the gasses is typically $B_2H_6$ which provides boron for purposes of doping the epitaxial silicon layer. Heat lamps (not shown) heat the wafers within the wafer processing chambers 20 to a temperature of between 600° C. and 1300° C.

Once the formation of the epitaxial silicon layer on one of the wafers is finalized, the processing gasses within the respective chambers 20 are replaced by pure hydrogen gas to purge the chambers 20. (Step 11). The respective slitvalve 82 is then opened. (Step 12). The respective wafer is transferred, utilizing the robot 84, to the cooldown chamber 22. (Step 13). Transfer of the wafer takes about twenty seconds. The wafer remains within the cooldown chamber 22 for about sixty seconds. (Step 14). The robot 84 then transfers the wafer from the cooldown chamber 22 back to the wafer cassette 28. (Step 15). The wafer is thus transferred from the chambers 20 to the wafer cassette 28 without ever being exposed to oxygen or any other gas that can form an oxide on the epitaxial silicon layer.

The process of forming an expitaxial silicon layer on each wafer is continued until all the wafers are processed in a similar manner and all the wafers are located back on the wafer cassette 28. It takes between one and two hours to process twenty-five wafers when forming a 5 micron thick epitaxial silicon layer on each wafer. While the wafers from the first loadlock assembly 14A are processed, more wafers can be located on the wafer cassette 28 of the second loadlock assembly 14B.

Once the wafers are located on the wafer cassette 28 of the first loadlock assembly 14A, the slitvalve 38 thereof is closed. (Step 16). The wafers 52 are then typically at a temperature of less than 100° C., but this temperature can vary depending on the time spent in the cooldown chamber 22.

The pump 30 is then again switched on so that nitrogen gas then flows out of the enclosure 34. (Step 17). The enclosure 34 is pumped down to a pressure of about 5 Torr. The pump 30 is then switched off. (Step 18). The ozone generator 64 is then switched on and the valve 70 is opened so that an ozone gas and oxygen gas mixture flows into the top of the enclosure 34. (Step 19). The ozone gas and oxygen mixture continues to flow into the enclosure 34 until the pressure within the enclosure 34 reaches about 600 Torr. The valve 70 is then dosed and the ozone generator 64 is switched off. (Step 20).

The wafers 52 are then simultaneously exposed to the ozone gas within the enclosure 34. Exposure of the epitaxial silicon layer on the wafer 52 results in oxidation of the epitaxial silicon layer. The wafers 52 are exposed to the ozone gas for a period from one to fifteen minutes. The wafers 52 are simply "soaked" in the ozone gas i.e., there are no additional sources of excitation which, for example, create a plasma or create certain photo effects. An oxide layer forms over the epitaxial silicon layer of each wafer and has a thickness of about 10 Å to about 15 Å, as measured by a multiple wavelength ellipsometry technique, for exposure to ozone gas of about fifteen minutes. The oxide layer that forms on the wafer is extremely pure because of the controlled conditions to which the wafers 52 are exposed, including the purity of the ozone gas and oxygen gas mixture to which the wafers 52 are exposed.

As mentioned previously, hydrogen is used within the wafer processing chamber 20. Hydrogen is highly explosive when mixed with ozone or oxygen. However, for the hydrogen in the processing chambers 20 to mix with the ozone within the enclosure 34, the system 10 has to fail simultaneously in a number of respects. First, there should be hydrogen within one of the wafer processing chambers 20. Second, the hydrogen should leak past a respective slitvalve 82 of the relevant wafer processing chamber 20. Leakage of hydrogen past the slitvalve 82 would only occur if the slitvalve 82 does not seal sufficiently on the wafer processing chamber or when the slitvalve 82 is not dosed when hydrogen is introduced into the wafer processing chamber 20. Third, it is required that ozone be present within the enclosure 34. Fourth, ozone should leak from the enclosure 34 into the transfer chamber 18. Because the enclosure 34 is maintained at a pressure below that of the transfer chamber 18, it is highly unlikely that there would be any flow of gasses from the enclosure 34 into the transfer chamber 18.

Furthermore, it should be noted that the pressure within the enclosure 34 never goes over atmospheric pressure so that there is a substantially reduced likelihood that ozone gas can escape from the enclosure 34 to a surrounding area and cause exposure of personnel.

It should also be noted that, in the embodiment described, ozone is only present within the apparatus 32 when generated by the ozone generator 64 which is only while the enclosure 34 is being filled with ozone. There is therefore no contained source of ozone (other than in the loadlock chambers 24) which may leak and cause exposure to personnel or other reactive gasses. Ozone gas is thus generated at the point of use.

The pump 30 is then again switched on so that the pressure within the enclosure 34 reduces to about 5 Torr. (Step 21). The ozone gas flowing through the pump 30 is pumped to a location distant from the system 10, where the ozone gas is neutralized. The ozone gas may for example be neutralized by treatment with a chemical to form oxygen, be scrubbed in a fluidized bed of silica, or be scrubbed in another liquid system.

The valve 68 is then opened so that the enclosure 34 is filled with nitrogen gas. (Step 22). The door 40 is then opened and the wafers 52 are transferred from the enclosure 34 into the factory integration unit 12. The factory integration unit 12 is filled with air. (Step 23). The air within the factory integration unit 12 does not form an oxide layer on the epitaxial silicon layer because of the oxide layer which is already formed thereon due to exposure to ozone.

It takes about twenty-five minutes to process the wafers within the first loadlock assembly 14A, as measured from when the slitvalve 42 is closed until the wafers 52 are removed from the loadlock chamber 24. The time taken to process twenty-five wafers by the first loadlock assembly 14A is less than the time taken to process twenty-five wafers within the wafer processing chambers 20 and cooling the wafer down in the cooldown chamber 22, because the wafers are processed in batch.

Figure 4:
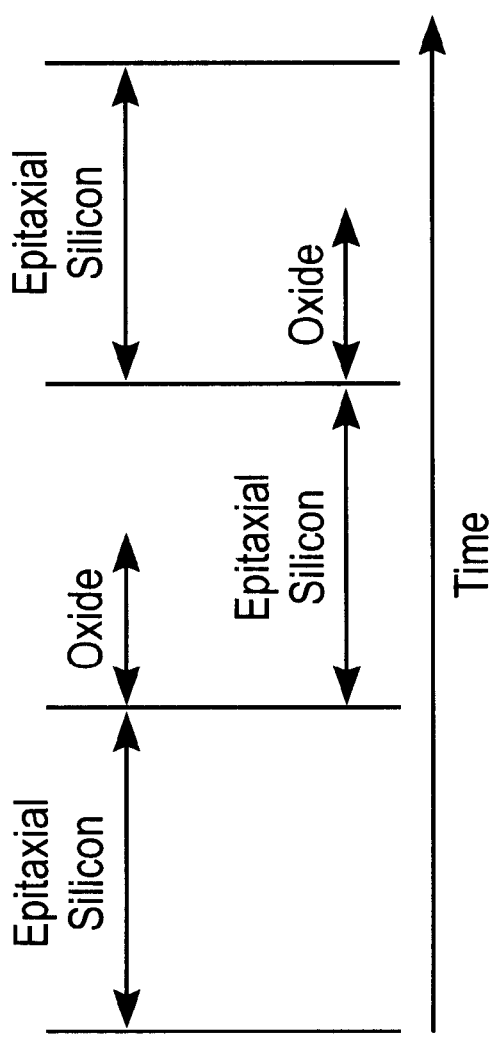
FIG. 4 is a time chart of how the system operates.

As illustrated in FIG. 4 the first loadlock assembly 14A can thus be used in an epitaxial silicon cycle wherein wafers are transferred to the wafer processing chamber 20 and the cooldown chamber 22 and including every step from step 8 to step 16 in FIG. 3. The first loadlock assembly 14A can then be used in a oxide cycle wherein the wafer is exposed to ozone gas and including every step from step 17 to step 23 in FIG. 3. At the same time when the first loadlock assembly 14A is used for an oxide cycle, the second loadlock assembly 14B can be used for a epitaxial silicon cycle, whereafter the second loadlock assembly 14B can be used for an oxide cycle. When the second loadlock assembly 14B is used in the oxide cycle, the first loadlock assembly 14A can be used in a epitaxial silicon cycle. It can thus be seen that, because the oxide cycles are shorter than the epitaxial silicon cycles, there is no lapse in time from one epitaxial silicon cycle to a next epitaxial silicon cycle.

Figure 5:
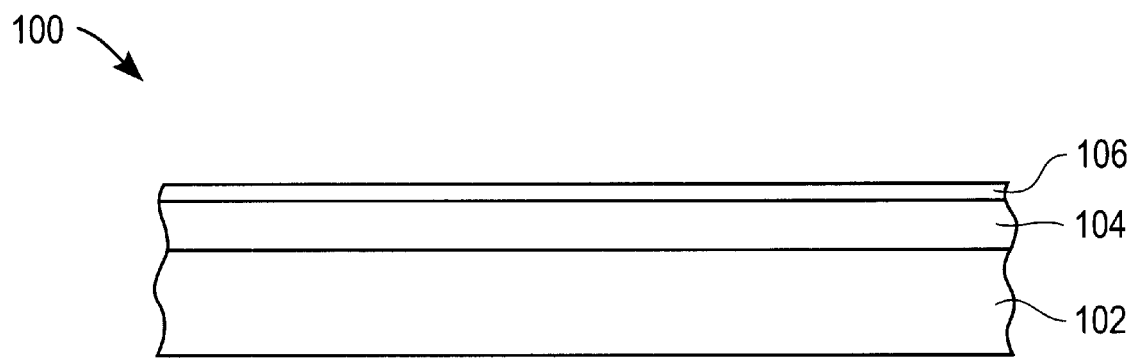
FIG. 5 is a cross-sectional side view of a wafer which is processed according to the invention.

FIG. 5 illustrates a wafer 100 which is processed in accordance with the invention. The wafer includes a monocrystalline substrate 102 on which an epitaxial silicon layer 104 is formed. A silicon dioxide layer 106 is formed on the epitaxial silicon layer 104. The silicon dioxide layer can later be removed to leave the expitaxial silicon layer 104 exposed and containing substantially no impurities. The silicon dioxide layer can, for example, be removed in a aqueous solution of hydrogen fluoride.

Figure 6:
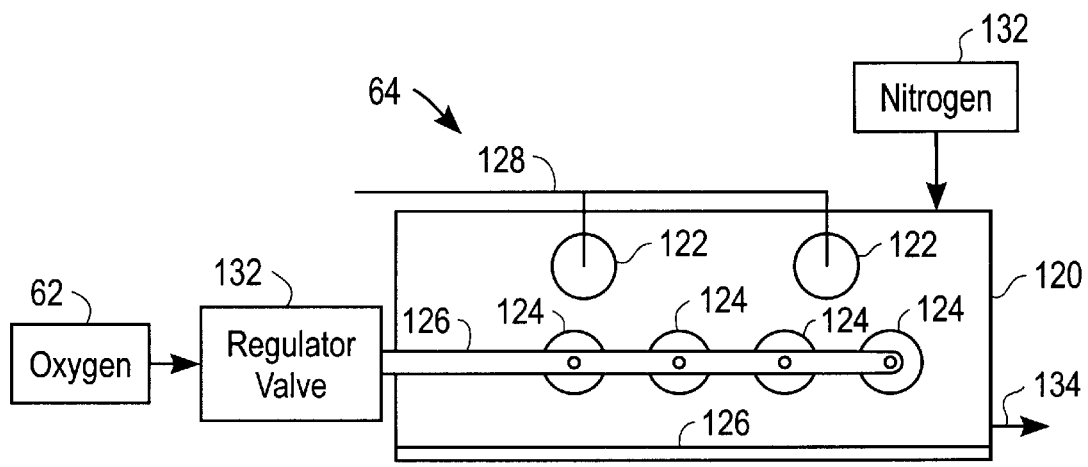
FIG. 6 is a cross-sectional end view of an ozone generator which is used in the loadlock assembly.
Figure 7:
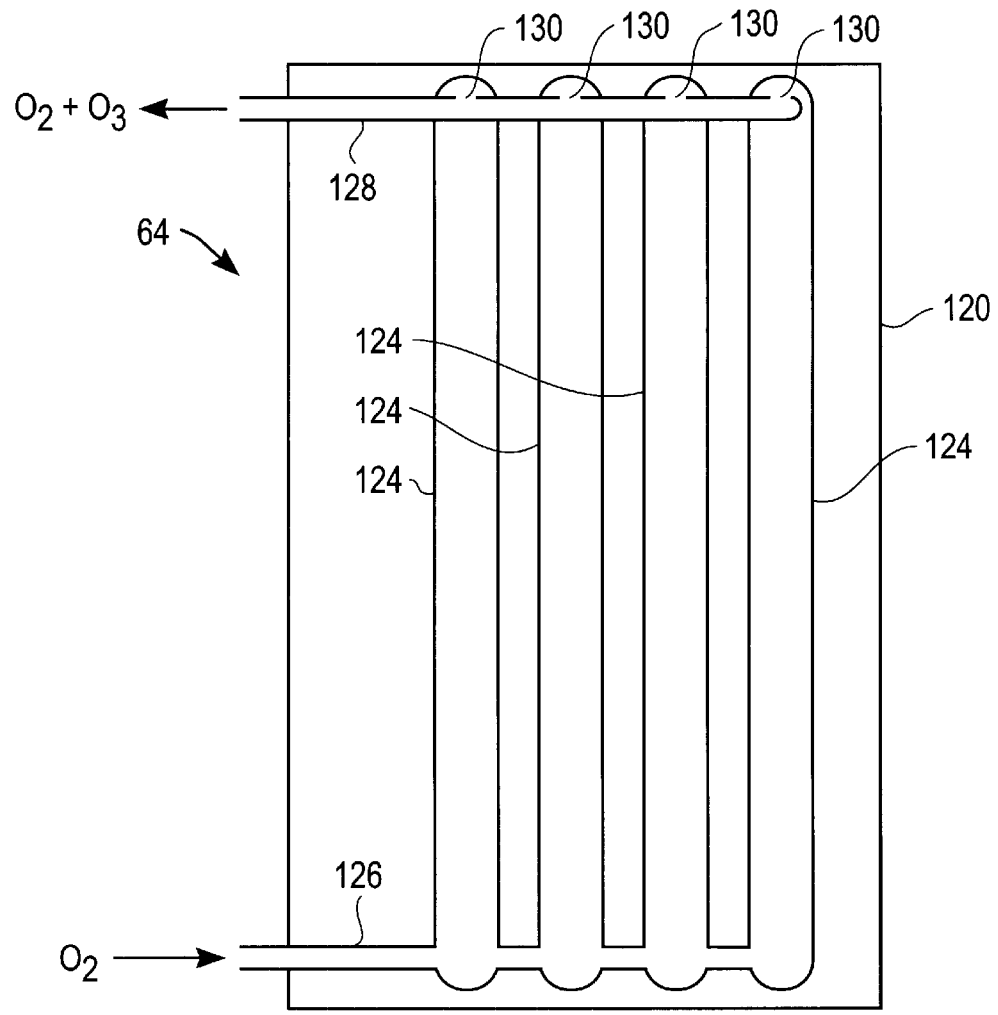
FIG. 7 is a cross-sectional side view of the ozone generator.

FIG. 6 and FIG. 7 illustrate the ozone generator 64 in more detail. The ozone generator 64 includes a housing 120, two ultraviolet lamps 122, four quartz tubes 124, an inlet pipe 126, and an outlet pipe 128.

The housing 120 is leak tight and dust proof. A mirror 126 is located on a lower surface of the housing 120.

The ultraviolet lamps 122 are located within the housing 120 on a side thereof opposing the mirror 126. Electrical connectors 128 extend into the housing 120 to the ultraviolet lamps 122. The ultraviolet lamps 122 can be energized by supplying electricity through the cables 128. A leak tight interface exists between the housing 120 and the cables 128 where the cables extend into the housing 120.

Each pipe 126 or 128 extends into the housing 120. A leak tight interface also exists between each pipe 126 or 128 and the housing 120 where the pipe 126 or 128 extends into the housing 120. The pipes 126 and 128 are located on opposing sides of the housing 120 as can be seen in FIG. 7. The inlet pipe 126 has an inlet opening therein. The pipe 126 interconnects ends of the tubes 124 to one another. The pipe 128 extends through ends of the tubes 124 opposing the ends that are interconnected by the pipe 126. Small openings 130 are formed in the pipe 128 within the tubes 124. Each opening 130 is typically about 2 mm in diameter. The openings 130 are located facing away from a flow passage of a gas flowing through the tubes 126 so as to avoid a flow channel within each tube 126 and to ensure mixing of a gas flowing through each tube 126.

The oxygen source 62 is connected to the inlet tube 126 through a regulator valve 132. The regulator valve 132 can be adjusted so as to control flow to the inlet tube 126.

A nitrogen source 132 is connected to the housing 120. A purge gas outlet 134 is also provided out of the housing 120.

Nitrogen from the nitrogen source 132 flows through the housing 120 in an area around the tubes 124. The ultraviolet lamps 122 are switched on by providing electricity through the cables 128. Oxygen from the oxygen source 62 flows through the regulator valve 132 and the pipe 126 to the tubes 124. Ultraviolet light is transmitted by the ultraviolet lamps 122. The quartz of the tubes 124 is transmissive so that the ultraviolet light enters the tubes 124. One of the ultraviolet lamps is located above two of the tubes 124 and another one of the ultraviolet lamps 122 is located above another two of the tubes 124. A substantially equal amount of ultraviolet light enters the tubes 124 because of substantially equal spacing of the lamps 122 over the tubes 124. More ultraviolet light reflects from the mirror 126 and enters the tubes 124 from an opposing side. The ultraviolet light results in a change of some of the oxygen gas within the tubes 124 to ozone gas. A mixture of oxygen gas and ozone gas flows around the pipe 128 and leaves the tubes 124 through the openings 130, from where the mixture flows through the pipe 128 out of the housing 120. While ozone is formed within the tubes 124, the nitrogen in the area around the tubes 124 suppresses ozone generation outside of the tubes 124. This reduces exposure of ozone to people, thereby making the ozone generator 64 safe to operate, and reduces the chance of ozone degradation of components of the ozone generator 64 located externally of the tubes 124.

The openings 130 are restrictions in the path of the mixture of oxygen and ozone leaving the tubes 124. Because of the restrictions provided by the openings 120, free flow of gas through the tubes 124 is restricted. Because of restrictions provided by the openings 120, the gas remains within the tubes 124 for longer and the flow thereof is more evenly distributed between the tubes 124. The residence time of the mixture within the tubes 124 is also increased.

Figure 8:
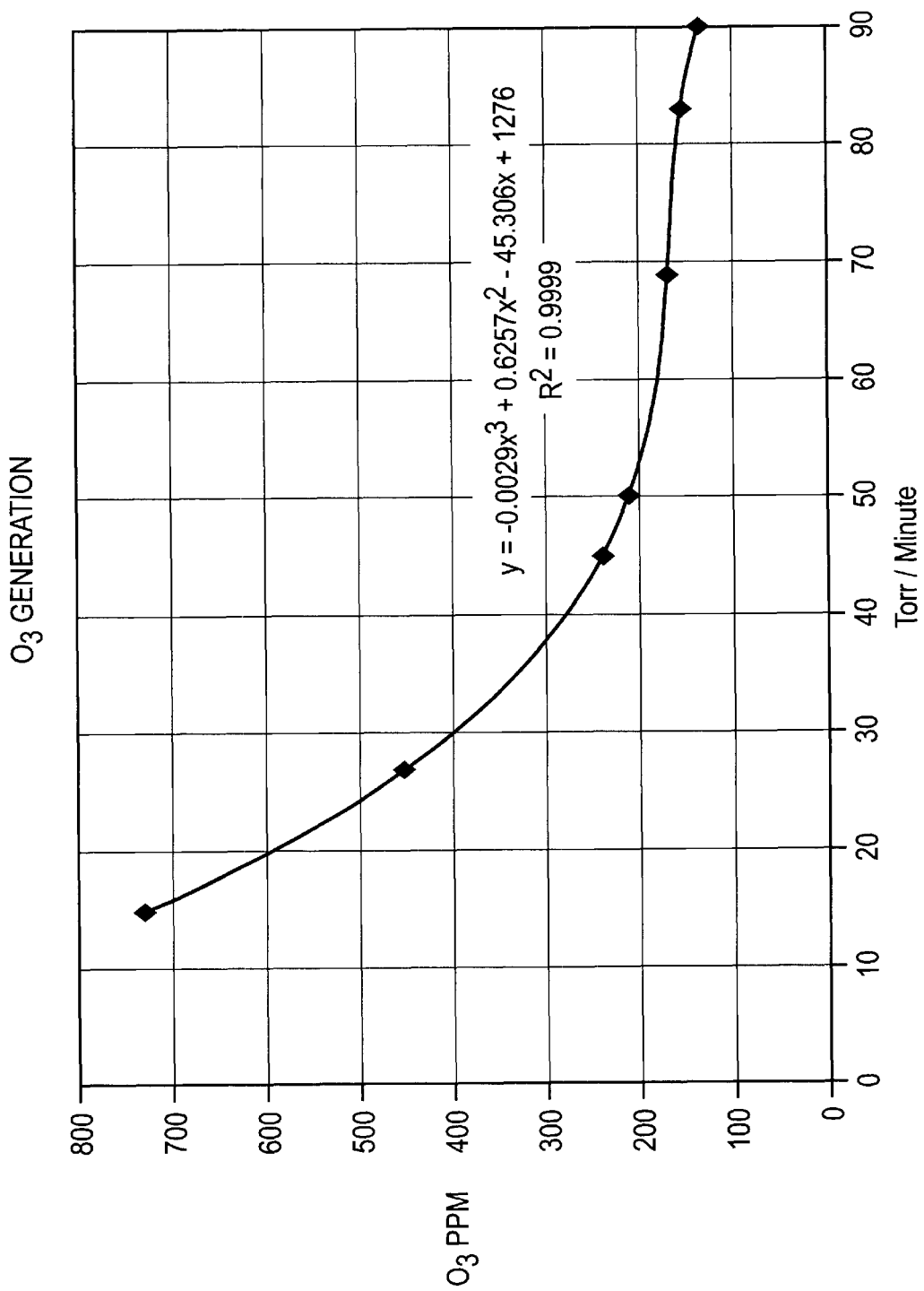
FIG. 8 is a graph of ozone concentration against backfill rate.

FIG. 8 is a graph of ozone generation. A horizontal axis of FIG. 8 is the rate at which the loadlock chamber is filled in Torr per minute. The higher the valve on the horizontal axis, the faster the loadlock chamber will be filled. A backfill rate of 60 Torr per minute, for example, means that the loadlock chamber is filled to 600 Torr within 10 minutes. The loadlock is preferably filled to 600 Torr within 20 minutes to maintain throughput, i.e. the rate on the horizontal axis is preferably at least 30.

A vertical axis of the FIG. 8 graph is ozone concentration in parts per million. It can be seen from the graph that the ozone concentration is higher for lower filling rates of the load lock chamber. Furthermore, there is an appreciable increase in ozone concentration for filling rates below 50 (i.e. a filling time of more than 12 minutes). The filling rate is therefore preferably between 20 Torr per minute and 50 Torr per minute for purposes discussed with reference to FIG. 8 alone.

Figure 9:
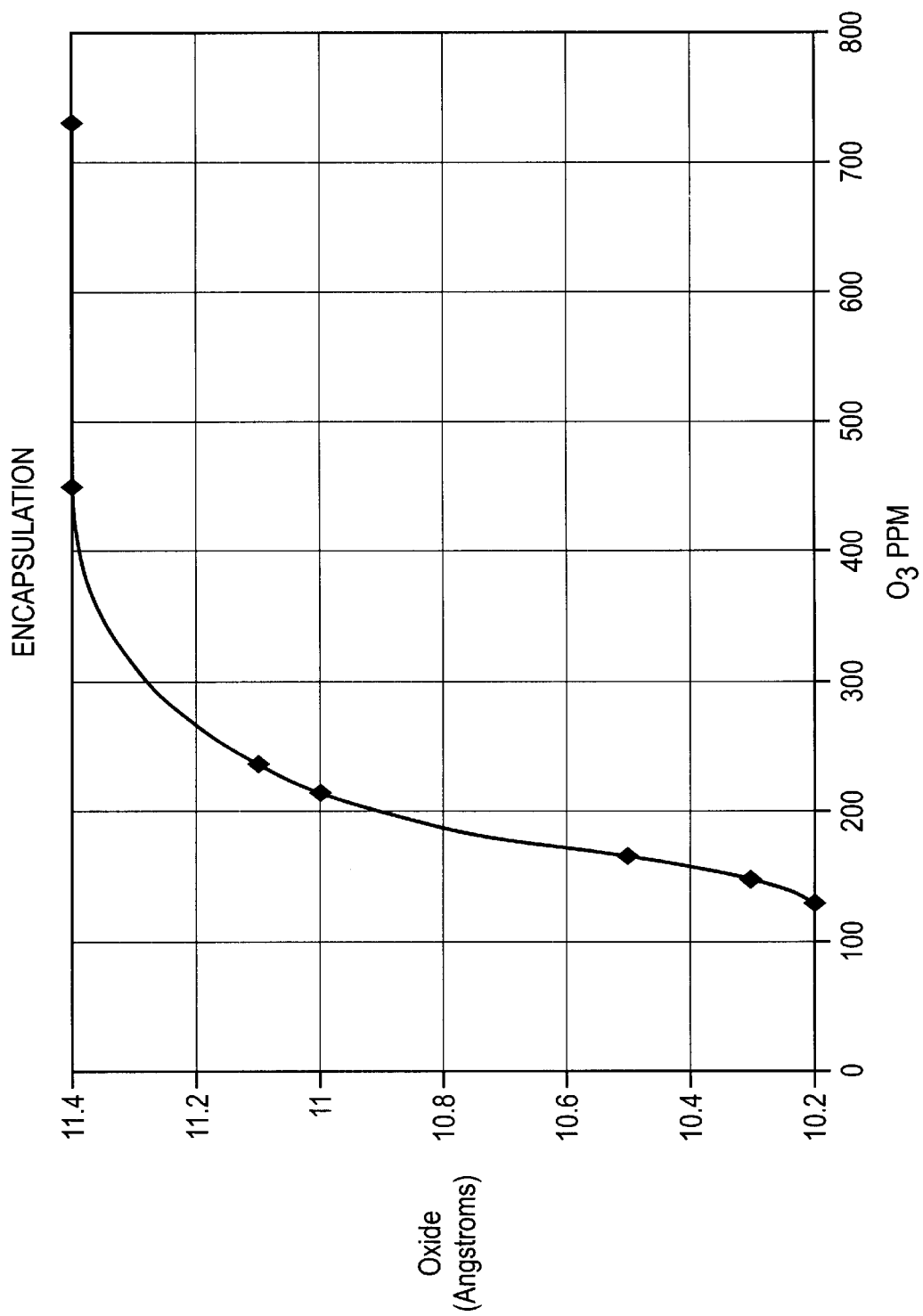
FIG. 9 is a graph of oxide formation against ozone concentration.

FIG. 9 is a graph of encapsulation of a wafer with an oxide formed with ozone gas. A horizontal axis of the FIG. 9 graph is the ozone concentration in parts per million and the vertical axis is oxide thickness as measured with a single wavelength ellipsometry technique. The wafer is maintained at about room temperature and is exposed to the air and ozone gas mixture for 12 minutes. There is an increase in oxide thickness with ozone concentration up to an ozone concentration of about 400 parts per million. In order to obtain an oxide thickness which is sufficiently thick the ozone concentration is preferably at least 250 parts per million. From FIG. 9 can thus be gathered that the ozone concentration is preferably between 250 parts per million and 350 parts per million. Referring again to FIG. 8, it can be seen that such an ozone concentration requires a filling rate of between 33 Torr per minute and 45 Torr per minute. In order to maintain an ozone concentration of at least 250 parts per million and an appreciable oxide thickness, the loadlock is preferably filled at a rate of about 45 Torr per minute.

Figure 10:
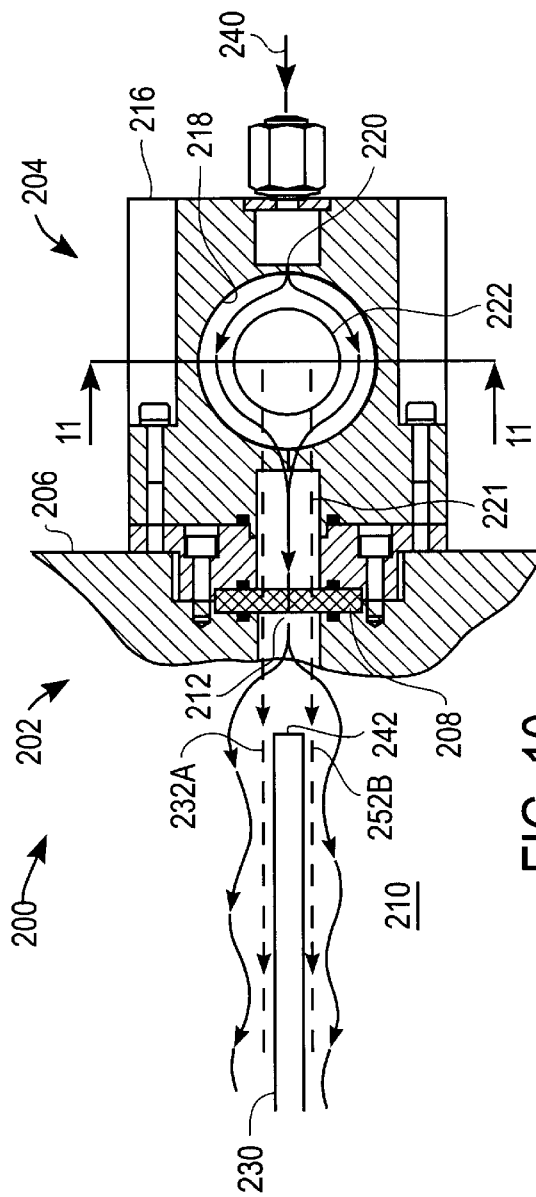
FIG. 10 is a cross-sectional side view of a portion of a loadlock assembly used in a system, for processing a wafer, according to an alternative embodiment of the invention.

Single-wafer Exposure to High Concentration Levels of Ozone Gas Suitable for Epitaxial Silicon Deposition on Small or Large Numbers of Wafers FIG. 10 illustrates a portion of a loadlock assembly 200 according to another embodiment of the invention. The loadlock assembly 200 includes a loadlock chamber 202 and an ozone generator 204.

The loadlock chamber 202 includes a chamber body 206 and a window 208. The window 208 is secured to the chamber body 206. An enclosure 210 is defined within the loadlock chamber 202. An inner surface of the chamber body 206 defines a portion of the enclosure 210 and an inner surface of the window 208 also defines a portion of the enclosure 210. The window 208 is transmissive to ultraviolet radiation and has a plurality of small ozone gas openings 212 formed therein.

The ozone generator 204 includes a block body 216 which is secured to the chamber body 206. The block body 216 has defined therein an ozone generation chamber 218. Small air inlet openings 220 are formed through one side of the block body 216 into the ozone generation chamber 218. A slot 221 is formed from the ozone generation chamber 218 out of the block body 216 on a side thereof opposing the air inlet openings 220. The slot 221 is located over the window 208.

Figure 11:
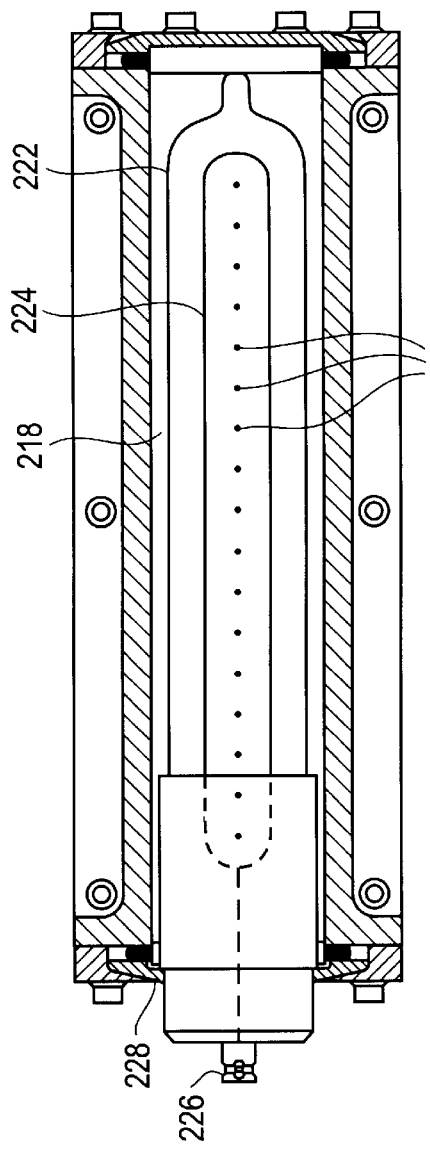
FIG. 11 is a cross-sectional end view of an ozone generator on 11—11 of FIG. 10.

The ozone generator 204 also includes an ultraviolet source lamp 222. The ultraviolet source lamp 222 is located within the ozone generation chamber 218. FIG. 11 is a view on 11—11 in FIG. 10 and illustrates that the ultraviolet source lamp 222 has a filament 224 and a terminal 226. The terminal is connected to the filament 224 so that electric current can be provided through a terminal 226 to the filament 224. The terminal 226 is located externally of the block body 216 and a seal 228 is located between a surface of the ultraviolet source lamp 222 and the block body 216 to prevent gas from escaping from within the ozone generation chamber 218. The filament 224, when electric current flows therethrough, creates ultraviolet radiation, according to known principles in the art. The openings 220 are evenly spaced over the width of the block body 216. The openings 212 in FIG. 10 have an arrangement that is similar to the openings 220.

In use, a wafer 230 is located in a horizontal plane with a center line thereof substantially at the same elevation as the ozone gas openings 212. An electric current is then provided through the terminals 226 to the filament 224 so that the filament 224 creates ultraviolet light 232A and 232B. The ultraviolet light 232A and 232B radiates horizontally through the slot 221 and then through the window 208. The ultraviolet light 232A then radiates horizontally over an upper surface of the wafer 230 and the ultraviolet light 232B radiates horizontally over a lower surface of the wafer 230. The light 232A and 232B radiates parallel to upper and lower surfaces of the wafer 230.

Air 240 is introduced through the air inlet openings 220 into the ozone generation chamber 218. The air flows over the ultraviolet source lamp 222 into the slot 221. Ultraviolet light radiating from the ultraviolet source lamp 222 into the ozone generation chamber 218 converts a first amount of the oxygen to a first amount of ozone gas. A gas flowing from the slot 221 into the ozone gas openings 212 includes a mixture of unconverted air and the first amount of ozone gas.

The air then flows from the ozone gas openings 212 into the enclosure 210 over upper and lower surfaces of the wafer 230. The upper and lower surfaces of the wafer 230 are thereby exposed to the first amount of ozone gas (generated in the ozone gas generation chamber 218).

As the gas flows over the wafer 230 the first amount of ozone gas depletes. Such depletion of the first amount of ozone gas could lead to a lower rate of sealing of surfaces of the wafer 230 located distant from an edge 242 thereof closest to the ozone gas openings 212. However, the ultraviolet light 232A and 232B radiates through the remainder of the first amount of ozone gas and the unconverted air, thereby converting the unconverted air to a second amount of ozone gas while located over surfaces of the wafer 230. The second amount of ozone gas, that is continuously being generated, maintains a concentration of ozone gas relatively high. Sealing rates of portions of surfaces of the wafer 230 located distant from the edge 242 are thereby maintained high.

Figure 12:
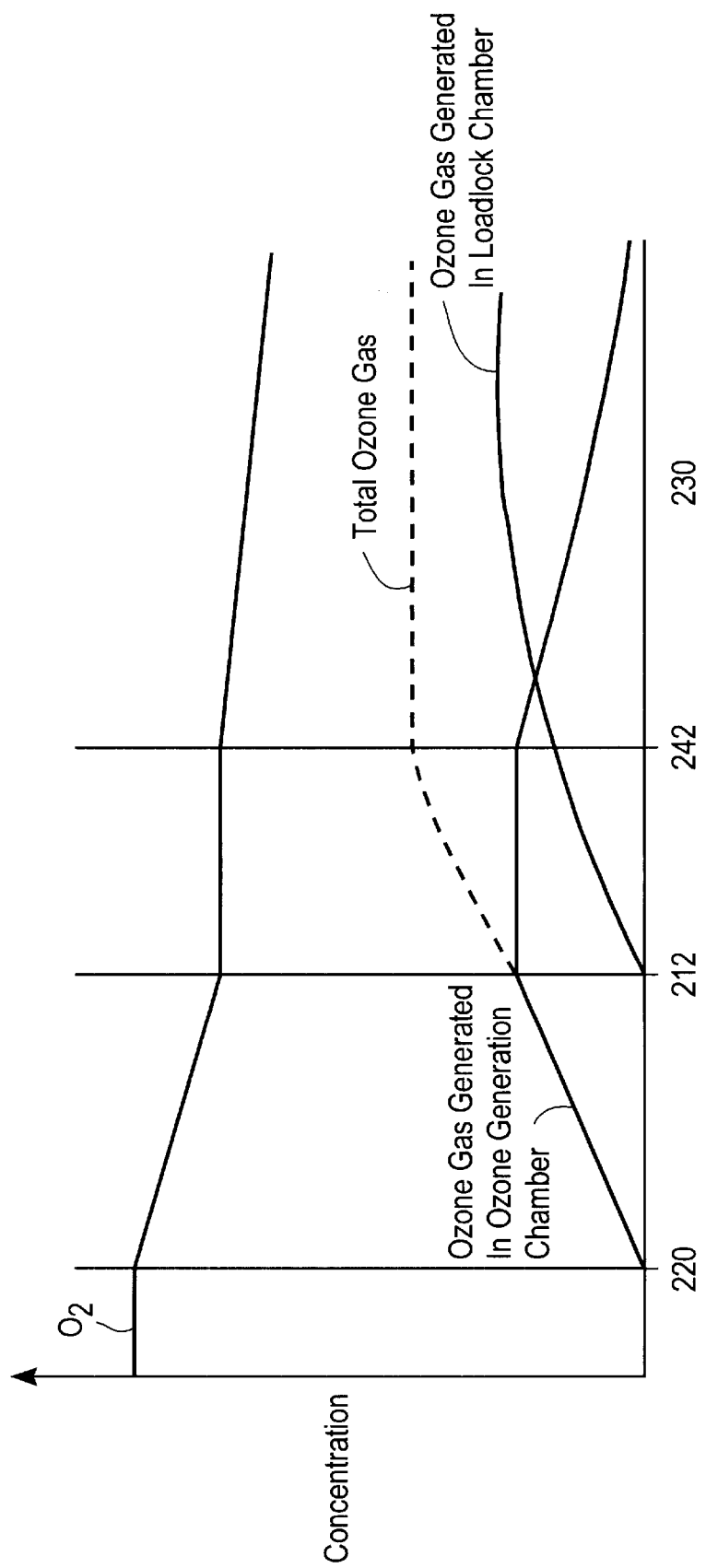
FIG. 12 is a graph illustrating concentration levels of air, a first amount of ozone gas generated in the ozone generation chamber, and a second amount of ozone gas generated in a loadlock chamber of the loadlock assembly of FIG. 10.

FIG. 12 represents concentrations of gasses located within the loadlock assembly 200. The gas is initially entirely air as it enters the air inlet openings 220. The concentration of ozone gas then increases and the concentration of air decreased until the gasses leave the ozone gas openings 212. The concentration of these gasses then remain constant until they reach the edge 242 of the wafer 230. The concentration of ozone gas in these gasses then depletes as it flows over the wafer 230. However, ozone gas is also generated in the loadlock chamber 202 by the ultra-violet light 232A and 232B. The concentration of the ozone gas generated in the loadlock chamber 202 increases as the gasses flow over the wafer 230. The total concentration level of the ozone gas thereby remains relatively constant as the gasses flow over the surfaces of the wafer 230.

Figure 13:
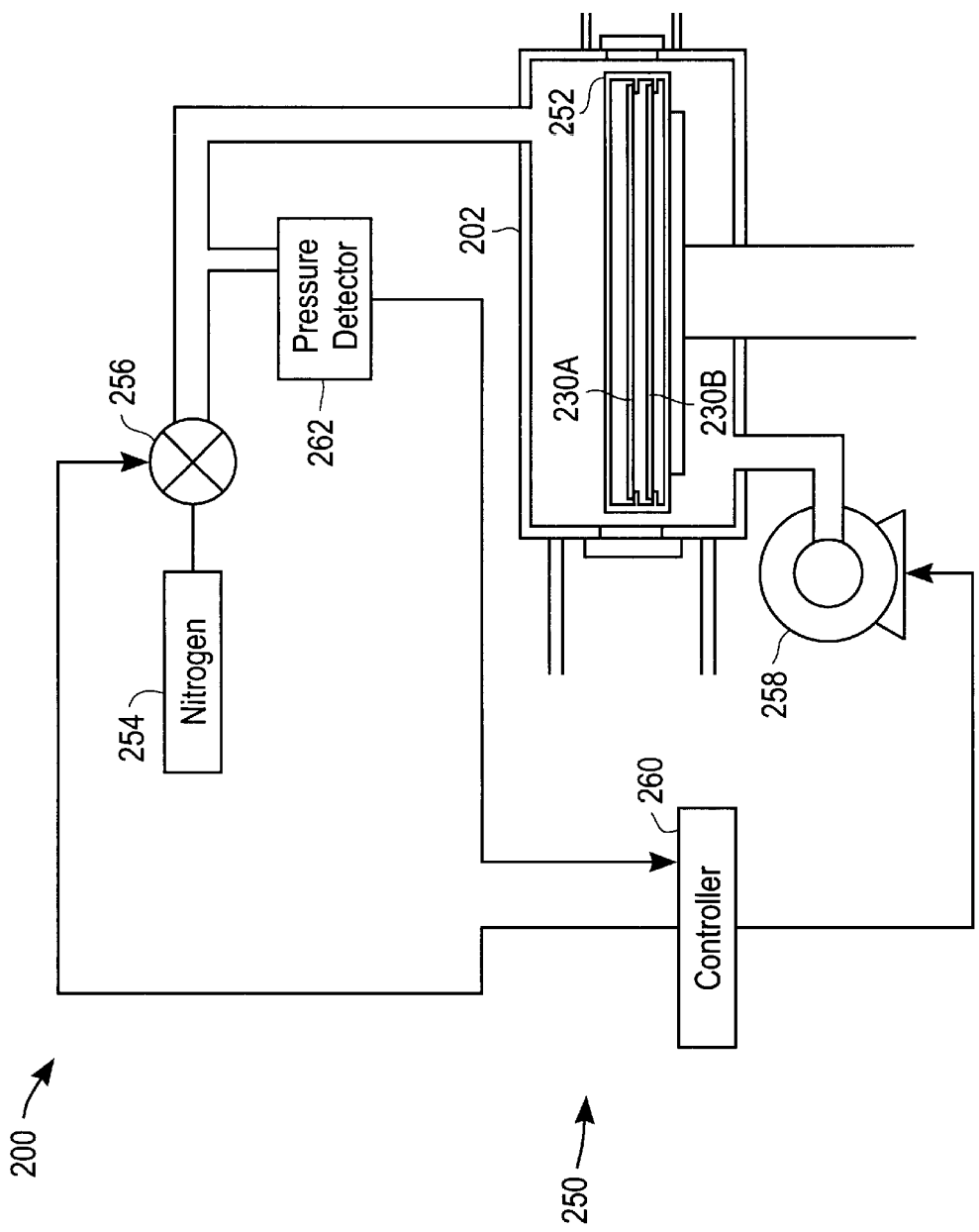
FIG. 13 is a cross-sectional side view of the loadlock assembly of FIG. 10, illustrating more components thereof.
Figure 14:
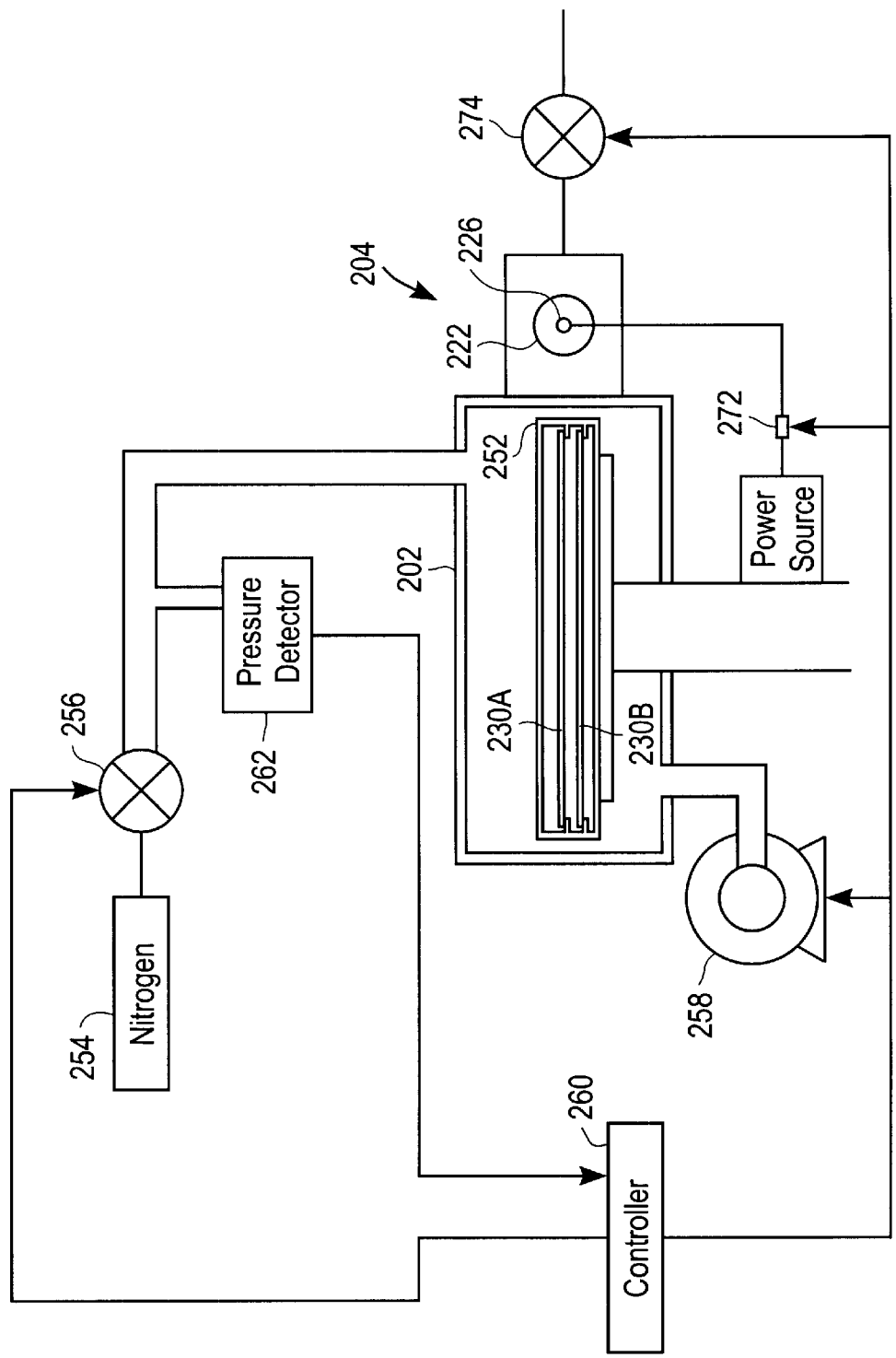
FIG. 14 is a cross-sectional end view of the loadlock assembly of FIG. 13.

FIGS. 13 and 14 illustrate further components of the loadlock assembly 200. FIG. 13 is a view similar to FIG. 2 and the similarities should be evident. FIG. 14 is a view in a direction 250 in FIG. 13.

The loadlock chamber 202 is smaller than the loadlock chamber 24 of FIG. 2. A wafer cassette 252 is also provided but can hold only two wafers 230A and 230B. Other components of the loadlock assembly 200 are similar to the components of the loadlock assembly 14 of FIG. 2. The loadlock assembly 200 also includes a source of nitrogen 254 and a nitrogen supply valve 256. A pump 258 is connected to the loadlock chamber 202. A controller 260 is responsive to a pressure detector 262 and controls the valve 256 and the pump 258 in a manner similar as hereinbefore described with reference to FIG. 2.

Referring to FIG. 14 in particular, the loadlock assembly 200 further includes a power source 270, a switch 272, and an air valve 274. The terminal 226 of the ultraviolet source lamp 222 is connected through the switch 272 to the power source 270. The air valve 274 controls flow of air into the block body 216 of the ozone generator 204. The controller 260 also controls operation of the switch 272 and the valve 274.

It can thus be seen that a first amount of ozone gas is generated outside of the loadlock chamber 202 and, in addition, a second amount of ozone gas is generated within the loadlock chamber 202 thereby maintaining ozone gas concentrations high. High concentrations of ozone gas allow for a wafer to be sealed at a higher rate utilizing the loadlock assembly 200 than when using the loadlock assembly 14 of FIG. 2. As previously mentioned with reference to FIG. 4, an ozone cycle utilizing a batch loadlock system takes about 25 minutes. However, because of higher concentrations of ozone gas utilizing the loadlock assembly 200, a wafer can be sealed in as little as 1 minute. Fast sealing of a wafer allows for more flexibility in operation of a system. For example, should only two wafers have to be processed, and each wafer takes about 3 minutes to process in a respective processing chamber, one wafer can then be located in a loadlock chamber 202 and be sealed for 1 minute, whereafter the other wafer can be located in the loadlock chamber 202 and be sealed for another minute. The total processing time of both wafers would then be 5 minutes. However, utilizing a batch loadlock such as the system of FIG. 2, it would take 3 minutes to process the two wafers in processing chambers and another 25 minutes to seal them thus totaling 28 minutes.

The system 10 of FIG. 1 can be modified by replacing the loadlock assemblies 14A and 14B with loadlock assemblies such as the loadlock assembly 200. Only the chambers 20B and 20C need to be used for epitaxial silicon formation.

Figure 15:
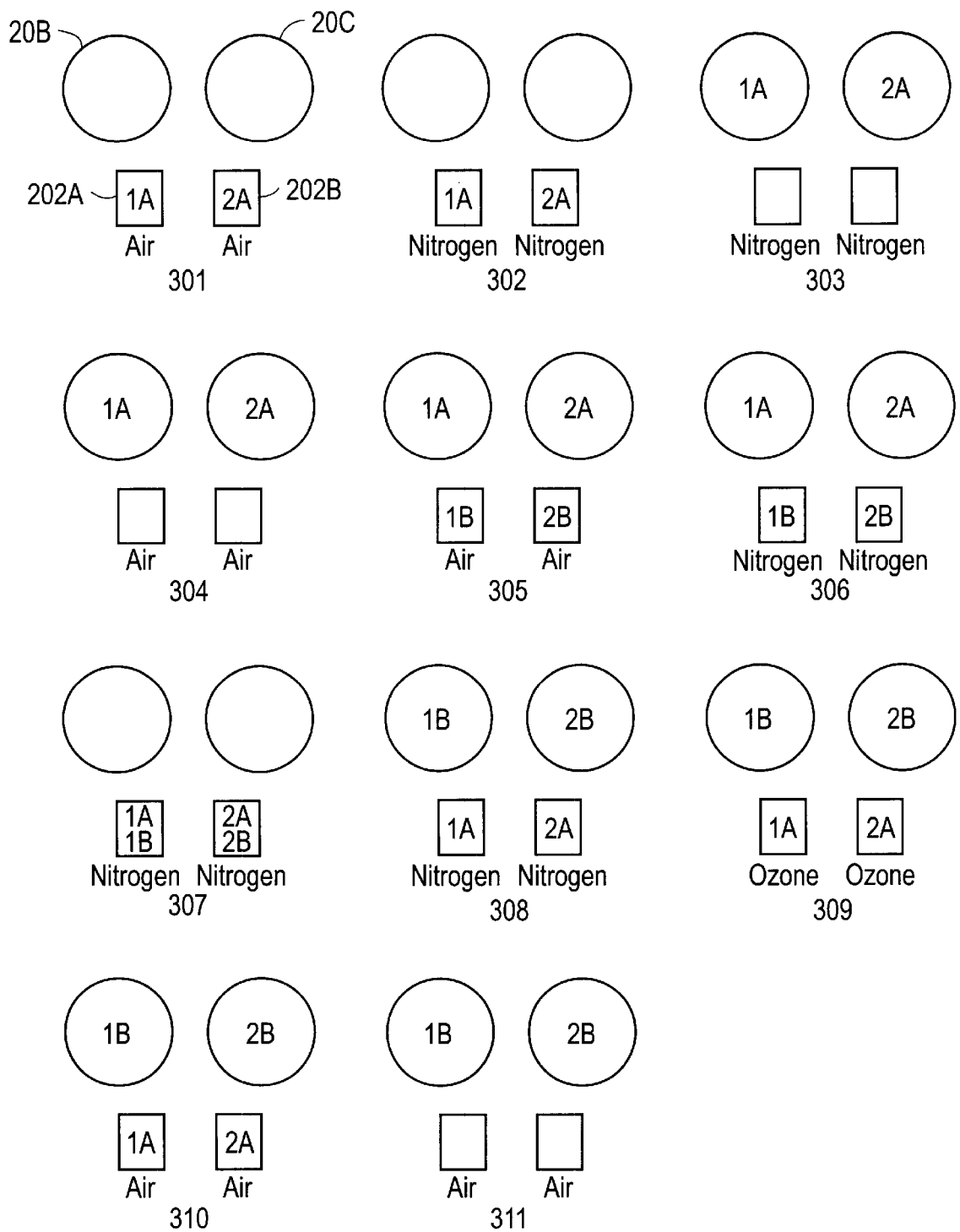
FIG. 15 is a diagramatic representation of one method in which the loadlock assembly of FIGS. 10 to 14 can be used.

FIG. 15 illustrates one method in which the system such as the system 10 in FIG. 1 having two loadlock chambers 202A and 202B can be used for wafer processing. Each loadlock chamber 202A or 202B forms part of a respective loadlock assembly such as the loadlock assembly 200. In step 301 the loadlock chambers 202A and 202B are opened to atmosphere so that they are filled with air, a wafer 1A is located in the loadlock chamber 202A, and another wafer 2A is located in the loadlock chamber 202B. In step 302 the loadlock chambers 202A and 202B are closed and filled with nitrogen gas, and in step 303, the wafers 1A and 2A are moved into the processing chambers 20B and 20C respectively. In steps 304, 305, and 306, two more wafers 1B and 2B are located in the loadlock chambers 202A and 202B respectively, as in the steps 301, 302, and 303.

In step 307, the wafers 1A and 2A are moved back into the loadlock chambers 202A and 202B, respectively. The wafers 3A and 36 are located at the top and the wafers 2B and 2B are located at the bottom. In step 308, the wafers 1B and 2B are moved into the processing chambers 20B and 20C so that only the wafers 1A and 2A in the loadlock chambers 202A and 202B. Epitaxial silicon is formed on the wafers 1A and 2A while they were located in the processing chambers 20B and 20C. The wafers 1A and 2A are ready to be sealed with ozone gas. The cassette holding the wafers 1A and 1B is moved so that the wafer 1A is in line with ozone gas openings in a window of the loadlock chamber 202A. Similarly, the cassette holding the wafers 2A and 2B is moved so that the wafer 2A is in line with ozone gas openings of a window of the loadlock chamber 202B.

In step 309 the loadlock chambers 202A and 202B are filled with ozone gas and the ultraviolet source lamps of the loadlock assemblies are switched on. The epitaxial silicon layers on the wafers 1A and 2A are thereby sealed with an oxygen layer.

In step 310, the loadlock chambers 202A and 202B are opened to atmosphere, and in step 311, the wafers 1A and 2A are removed from the loadlock chambers 202A and 202B. Step 311 is the same as step 304, except that the wafers 1A and 2A are replaced with the wafers 1B and 2B, respectively. The steps following step 304 can then again be carried out with following wafers. FIG. 15 therefore illustrates how a cassette and a respective one of the loadlock chambers 202A or 202B, holding two wafers 1A and 1B, or 2A and 2B, can be used.

Figure 16A:
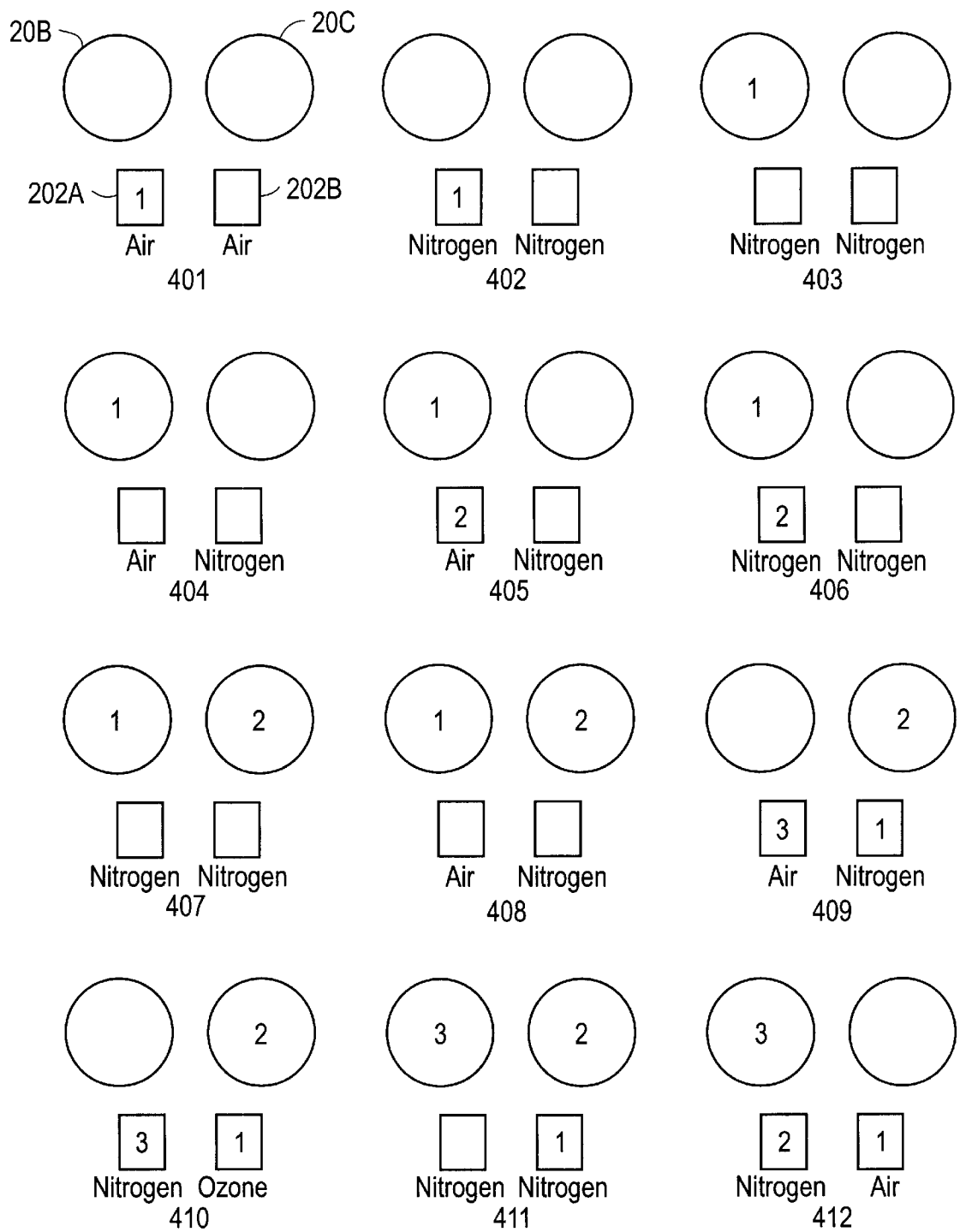
FIG. 16 is a diagramatic representation of another method in which the system can be used.
Figure 16B:
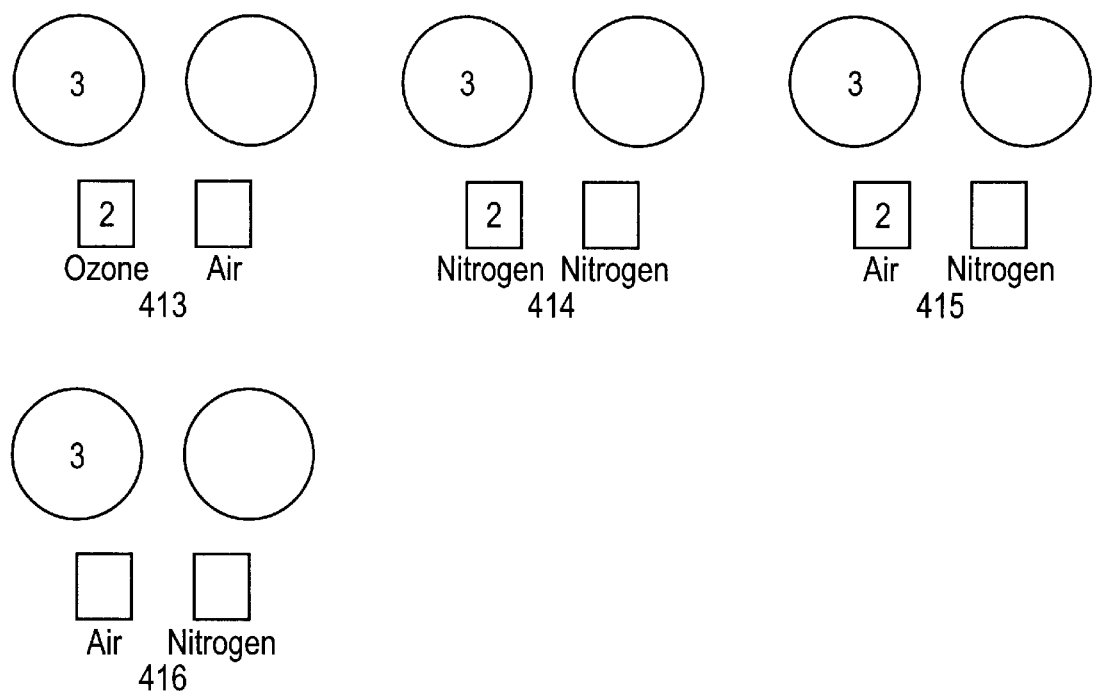

FIGS. 16A and 16B illustrates a method wherein only one shelf is required in a respective loadlock chamber 202A or 202B. In steps 401, 402, 403, and 404, the loadlock chamber 202A is open to atmosphere, a wafer 1 is located therein, the loadlock chamber is filled with nitrogen gas, the wafer 1 is moved into the processing chamber 20B, and the loadlock chamber 202A is again opened to atmosphere. In steps 405, 406, 407, and 408, another wafer 2 is located in the loadlock chamber, the loadlock chamber is filled with nitrogen gas, the wafer 2 is moved into the processing chamber 20C, and the loadlock chamber 202B is again opened to atmosphere. Epitaxial silicon layers are formed on the wafers 1 and 2 while located in the processing chambers 20B and 20C, respectively.

In step 409 another wafer 3 is located in the loadlock chamber 202A. In step 410, the wafer 1 is sealed utilizing ozone gas and the ultraviolet source lamp that radiates over the wafer 1. In step 411, the wafer 3 is moved into the processing chamber 20B. In step 412, the wafer 2 is moved into the loadlock chamber 202A. In step 413, the wafer 1 is removed from the loadlock chamber 202B, and the wafer 2 is sealed in the loadlock chamber 202A. In steps 414, 415, and 416, the loadlock chamber 202B is again filled with nitrogen gas, and the wafer 2 is removed out of the loadlock chamber 202A. The system following step 416 is the same as the system following step 404, except that the wafer 1 is replaced with the wafer 3. The step following step 404 can then again be repeated for subsequent wafers.

While certain exemplary embodiments have been described and shown in the accompanying drawings, it is to be understood that such embodiments are merely illustrative and not restrictive of the current invention, and that this invention is not restricted to the specific constructions and arrangements shown and described, since modifications to either of the above embodiments may occur to those ordinarily skilled in the art. In another embodiment an ozone source may, for example, be a contained source of ozone located externally of a loadlock chamber. In another embodiment, an ozone source such as an ozone generator may, for example, be located within a loadlock chamber.

What is claimed:

1. A method of processing a wafer, which includes:
   (a) locating a wafer in a wafer processing chamber of a system for processing a wafer;
   (b) forming a silicon layer on the wafer while located in the wafer processing chamber;
   (c) transferring the wafer from the wafer processing chamber to an ozonification chamber of the system while remaining substantially unexposed to air;
   (d) closing off communication between the processing chamber and the ozonification chamber;
   (e) allowing a first amount of ozone gas into the ozonification chamber;
   (f) exposing the wafer to the first amount of ozone gas while located in the ozonification chamber;
   (g) radiating ultraviolet light through an unconverted gas in the ozonification chamber thereby converting the unconverted gas to a second amount of ozone gas;
   (h) exposing the wafer to the second amount of ozone gas while located in the ozonification chamber; and
   (i) removing the wafer from the ozonification chamber.

2. A method according to claim 1 wherein the ozonification chamber is a loadlock chamber and in step (i) the wafer is removed out of the system.

3. A method according to claim 1 which includes:
   (j) generating the first amount of ozone gas in an ozone generation chamber that is in communication with the ozonification chamber.

4. A method according to claim 3 wherein the first amount of ozone gas is generated by radiating ultraviolet light through an unconverted gas in the ozone generation chamber.

5. A method according to claim 4 wherein the ultraviolet light radiating through the unconverted gas in the ozone generation chamber and the ultraviolet light radiating through the unconverted gas in the ozonification chamber originate from a common source lamp.

6. A method according to claim 5 wherein, when step (f) and step (h) are carried out, a pressure within the ozonification chamber is below a pressure in the wafer processing chamber.

7. A method according to claim 2 wherein, when step (f) and step (h) are carried out, a pressure within the loadlock chamber is below a pressure in the wafer processing chamber.

8. A method according to claim 1 wherein hydrogen gas is present within the processing chamber at any given time between when (e) is started and (h) ends.

9. A method according to claim 8 wherein the pressure within the loadlock chamber remains below atmospheric pressure from (e) to (h).

10. A method according to claim 1 wherein substantially no oxide layer forms on the silicon layer before exposure to the ozone gas.

11. A method of processing a wafer, which includes:
    (a) locating a wafer in a wafer processing chamber of a system for processing a wafer;
    (b) forming a silicon layer on the wafer while located in the wafer processing chamber;
    (c) transferring the wafer from the wafer processing chamber through a first opening of a loadlock chamber into the loadlock chamber of the system while remaining substantially unexposed to air;
    (d) closing off communication between the processing chamber and the ozonification chamber;
    (e) allowing oxygen gas into an ozone generation chamber;
    (f) conducting current through a filament of an ultraviolet light in the ozone generation chamber thereby converting some of the oxygen gas to a first amount of ozone gas;
    (g) allowing the first amount of ozone gas together with oxygen gas through an opening in a window into the loadlock chamber;
    (h) exposing the wafer to the first amount of ozone gas while located in the loadlock chamber;
    (i) radiating ultraviolet light from the filament through the window and then through the oxygen gas in the loadlock chamber thereby converting the oxygen gas in the loadlock chamber to a second amount of ozone gas;
    (j) exposing the wafer to the second amount of ozone gas while located in the loadlock chamber; and
    (k) removing the wafer through a second opening of the loadlock chamber from the loadlock chamber.

* * * * *